US008940995B2

(12) United States Patent
Park et al.

(10) Patent No.: US 8,940,995 B2
(45) Date of Patent: Jan. 27, 2015

(54) THERMOELECTRIC DEVICE AND METHOD FOR FABRICATING THE SAME

(75) Inventors: Young-Sam Park, Daejeon (KR);
Moon-Gyu Jang, Daejeon (KR);
Taehyoung Zyung, Daejeon (KR);
Younghoon Hyun, Seoul (KR);
Myungsim Jun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 887 days.

(21) Appl. No.: 12/632,403

(22) Filed: Dec. 7, 2009

(65) Prior Publication Data

US 2011/0000517 A1     Jan. 6, 2011

(30) Foreign Application Priority Data

Jul. 6, 2009  (KR) .................. 10-2009-0061354
Sep. 21, 2009  (KR) .................. 10-2009-0089114

(51) Int. Cl.
*H01L 35/12*     (2006.01)
*H01L 35/32*     (2006.01)

(52) U.S. Cl.
CPC .................................. *H01L 35/32* (2013.01)
USPC ........ 136/236.1; 136/200; 136/201; 136/205; 136/239

(58) Field of Classification Search
CPC ......... H01L 35/34; H01L 35/32; H01L 35/26; H01L 35/10
USPC .................. 136/200, 201, 205, 236.1, 239
See application file for complete search history.

(56) References Cited

U.S. PATENT DOCUMENTS

| 6,605,772 | B2 | 8/2003 | Harman et al. | |
|---|---|---|---|---|
| 6,790,744 | B2* | 9/2004 | Chen et al. | 438/415 |
| 7,872,253 | B2 | 1/2011 | Ohta et al. | |
| 2002/0100499 | A1* | 8/2002 | Hayashi et al. | 136/238 |
| 2004/0031515 | A1* | 2/2004 | Sadatomi et al. | 136/239 |
| 2006/0048809 | A1* | 3/2006 | Onvural | 136/212 |

(Continued)

FOREIGN PATENT DOCUMENTS

| JP | 02-106079 A | 4/1990 |
|---|---|---|
| JP | 07-038158 A | 2/1995 |

(Continued)

OTHER PUBLICATIONS

JP2002-118297, Nakanishi, Machine Translation, Apr. 2002.*

(Continued)

*Primary Examiner* — Devina Pillay

(57) ABSTRACT

A thermoelectric device is provided. The thermoelectric device includes first and second electrodes, a first leg, a second leg, and a common electrode. The first leg is disposed on the first electrode and includes one or more first semiconductor pattern and one or more first barrier patterns. The second leg is disposed on the second electrode and includes one or more second semiconductor pattern and one or more second barrier patterns. The common electrode is disposed on the first leg and the second leg. Herein, the first barrier pattern has a lower thermal conductivity than the first semiconductor pattern, and the second barrier pattern has a lower thermal conductivity than the second semiconductor pattern. The first/second barrier pattern has a higher electric conductivity than the first/second semiconductor pattern. The first/second barrier pattern forms an ohmic contact with the first/second semiconductor pattern.

19 Claims, 12 Drawing Sheets

(56) References Cited

U.S. PATENT DOCUMENTS

| | | | |
|---|---|---|---|
| 2006/0102223 A1* | 5/2006 | Chen et al. | ............... 136/201 |
| 2007/0137687 A1 | 6/2007 | Tanielian | |
| 2007/0157961 A1 | 7/2007 | Uchida et al. | |
| 2008/0017237 A1* | 1/2008 | Bray et al. | ............... 136/224 |
| 2008/0135082 A1 | 6/2008 | Hirono et al. | |
| 2009/0007952 A1 | 1/2009 | Kondoh et al. | |
| 2009/0205697 A2 | 8/2009 | Uchida et al. | |
| 2010/0252086 A1 | 10/2010 | Fujie | |

FOREIGN PATENT DOCUMENTS

| | | | | |
|---|---|---|---|---|
| JP | 11-251647 A | | 9/1999 | |
| JP | 2000-188426 A | | 7/2000 | |
| JP | 2001-156344 A | | 6/2001 | |
| JP | 2002-118297 | * | 4/2002 | ............... H01L 35/32 |
| JP | 2003-092432 | * | 3/2003 | ............... H01L 35/16 |
| JP | 2003-092435 A | | 3/2003 | |
| JP | 2009-520361 A | | 5/2009 | |
| JP | 2009-194309 A | | 8/2009 | |
| JP | 2010-027895 A | | 2/2010 | |
| WO | WO 2006/043514 A1 | | 4/2006 | |
| WO | WO 2007/132782 A1 | | 11/2007 | |
| WO | WO 2009/013918 A1 | | 1/2009 | |

OTHER PUBLICATIONS

JP2003-092432, Yamashita, Machine Translation, Mar. 2003.*

JP02106709, Kato, Human Translation, Apr. 1990.*

Terry M. Tritt et al., "Thermoelectrics: Direct Solar Thermal Energy Conversion," MRS Bulletin, Apr. 2008, pp. 366-368, vol. 33.

Allon I. Hochbaum et al., "Enhanced thermoelectric performance of rough silicon nanowires," Nature, Jan. 2008, pp. 163-168, vol. 451, Nature Publishing Group.

Terry M. Tritt et al, "Thermoelectric Materials, Phenomena, and Applications: A Bird's Eye View," MRS Bulletin, Mar. 2006, pp. 188-198, vol. 31.

L. Weber et al., "Transport Properties of Silicon," Applied Physics A Solids and Surfaces, Mar. 1991, pp. 136-140, Springer-Verlag.

Akram I. Boukai et al., "Silicon nanowires as efficient thermoelectric materials," Nature, Jan. 2008, pp. 168-171, vol. 451, Nature Publishing Group.

"English Translation of Korean Patent Application No. 10-2009-0061354 filed on Jul. 6, 2009", Jul. 6, 2009, pp. 1-16.

* cited by examiner

THERMOELECTRIC DEVICE AND METHOD FOR FABRICATING THE SAME

CROSS-REFERENCE TO RELATED APPLICATIONS

This U.S. non-provisional patent application claims priority under 35 U.S.C. §119 of Korean Patent Application Nos. 10-2009-0061354, filed on Jul. 6, 2009, and 10-2009-0089114, filed on Sep. 21, 2009, the entire contents of which are hereby incorporated by reference.

BACKGROUND

The present invention disclosed herein relates to thermoelectric devices, and more particularly, to thermoelectric devices based on semiconductor processes and methods for fabricating the same.

Thermoelectric devices convert thermal energy into electrical energy. Recently, thermoelectric devices are receiving much attention due to clean energy-oriented policy. A thermoelectric effect was discovered in 1800's by Thomas Seebeck. Thomas Seebeck connected bismuth and copper and disposed a compass therein. When one side of the bismuth is heated to high temperature, a current is induced due to a temperature difference. A magnetic field created by the induced current moves a needle of the compass, thereby discovering the thermoelectric effect.

A value of Figure of Merit (ZT) is used as an index of thermoelectric efficiency. The ZT value is proportional to the electric conductivity and the square of a Seebeck coefficient. The ZT value is inversely proportional to the thermal conductivity. Metal has a low Seebeck coefficient and its electric conductivity is proportional to its thermal conductivity according to Wiedemann-Franz law. Thus, metal has a limitation in increasing the ZT value. $Bi_2Te_3$ is widely used as thermoelectric material. However, thermoelectric devices based on $Bi_2Te_3$ use heavy metals and are difficult to reuse. Also, the thermoelectric devices based on $Bi_2Te_3$ are low in mechanical strength, difficult to miniaturize, and weak to moisture.

SUMMARY

Embodiments of the present invention provide thermoelectric devices and methods for fabricating the same by using semiconductor fabrication process technologies. The present invention forms a barrier pattern in a leg to reduce the thermal conductivity of the leg and increase the electric conductivity thereof.

The objects of the present invention are not limited to the aforesaid, and other objects not described herein will be clearly understood by those skilled in the art from descriptions below.

In some embodiments of the present invention, thermoelectric devices include: first and second electrodes; a first leg disposed on the first electrode and including one or more first semiconductor pattern and one or more first barrier patterns; a second leg disposed on the second electrode and including one or more second semiconductor pattern and one or more second barrier patterns; and a common electrode disposed on the first leg and the second leg, wherein the first barrier pattern has a lower thermal conductivity than the first semiconductor pattern, and the second barrier pattern has a lower thermal conductivity than the second semiconductor pattern.

In some embodiments, the first barrier pattern is disposed between the first semiconductor patterns. The first semiconductor patterns may include different materials or may have different electrical characteristics.

In other embodiments, the first semiconductor pattern is a first conductivity type semiconductor pattern, and the second semiconductor pattern is a second conductivity type semiconductor pattern.

In further embodiments, the first barrier pattern forms an ohmic contact with the first semiconductor pattern, and the second barrier pattern forms an ohmic contact with the second semiconductor pattern.

In other embodiments of the present invention, thermoelectric device arrays include: a plurality of thermoelectric devices each including: first and second electrodes; a first leg disposed on the first electrode and including one or more first semiconductor pattern and one or more first barrier patterns; a second leg disposed on the second electrode and including one or more second semiconductor pattern and one or more second barrier patterns; and a common electrode disposed on the first leg and the second leg, wherein the first electrode of each thermoelectric device is electrically connected to the second electrode of the adjacent thermoelectric device, and the common electrodes of the thermoelectric devices are electrically insulated from each other.

In further embodiments of the present invention, methods for fabricating a thermoelectric device include: forming a first electrode and a second electrode on a substrate; forming a first leg including one or more first semiconductor pattern and at least one first preliminary barrier pattern on the first electrode; thermally treating the first preliminary barrier pattern to form a first barrier pattern; forming a second leg including one or more second semiconductor pattern and at least one second preliminary barrier pattern on the second electrode; thermally treating the second preliminary barrier pattern to form a second barrier pattern; and forming a common electrode on the first leg and the second leg.

In some embodiments, the thermal treating of the first preliminary barrier pattern and the thermal treating of the second preliminary barrier pattern are performed simultaneously.

In other embodiments, the methods further include forming a capping pattern on the first leg before the forming of the second leg.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
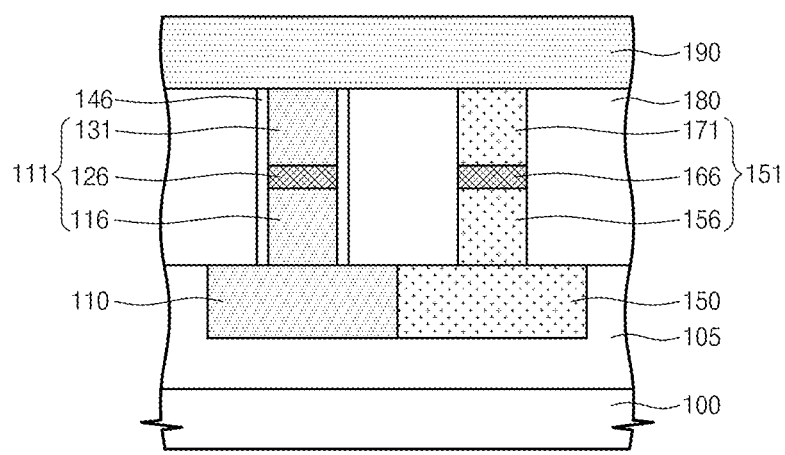
FIGS. 1 to 13 are sectional views illustrating a thermoelectric device and a method for fabricating the same according to an embodiment 1 of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the specification, like reference numerals refer to like elements.

It will be understood that when a layer (or film) is referred to as being "on" another layer or substrate, it can be directly on the other layer or substrate, or intervening layers may also be present. It will also be understood that although the terms first, second and third are used herein to describe various elements and steps, these elements or steps should not be limited by these terms. These terms are only used to distinguish one element or step from another element or step.

In the following description, the technical terms are used only for explaining specific exemplary embodiments while not limiting the present invention. The terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components.

In addition, the embodiments in the detailed description will be described with reference to sectional views or plan views as ideal exemplary views of the present invention. In the drawings, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate specific shapes of device regions. Thus, these should not be construed as limiting the scope of the present invention.

Embodiment 1

FIGS. 1 to 13 are sectional views illustrating a thermoelectric device and a method for fabricating the same according to an embodiment 1 of the present invention.

Referring to FIG. 1, a thermoelectric device according to an embodiment 1 of the present invention is provided. A preparing layer 105 may be provided on a substrate 100. The substrate 100 may be a silicon (Si) or germanium (Ge) substrate. The preparing layer 105 may be a silicon (Si) or germanium (Ge) layer. The preparing layer 105 may be an insulating layer. A first electrode 110 and a second electrode 150 may be provided in the preparing layer 105. The first electrode 110 may be a semiconductor electrode. The second electrode 150 may be a semiconductor electrode. The first and second electrodes 110 and 150 may be a metal layer or a metal compound layer. The first and second electrodes 110 and 150 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The first electrode 110 may be electrically connected to the second electrode 150 by contacting the second electrode 150. A third electrode (not illustrated) may be provided between the first electrode 110 and the second electrode 150. The third electrode may have a different electric or thermal conductivity than the first and second electrodes 110 and 150. The third electrode may electrically connect the first electrode 110 and the second electrode 150.

A first leg 111 may be provided on the first electrode 110. The first leg 111 may include a first semiconductor pattern 116, a first barrier pattern 126, and a second semiconductor pattern 131. The first semiconductor pattern 116 and the second semiconductor pattern 131 may include an N-type semiconductor. The first semiconductor pattern 116 and the second semiconductor pattern 131 may include different materials or may have different electrical characteristics. For example, the first semiconductor pattern 116 and the second semiconductor pattern 131 may have different electric conductivities. The first barrier pattern 126 may be provided between the first semiconductor pattern 116 and the second semiconductor pattern 131. The first barrier pattern 126 may be formed in plurality in the first leg 111. The first barrier pattern 126 may form an ohmic contact with the first semiconductor pattern 116 and the second semiconductor pattern 131. The first barrier pattern 126 may include one or more selected from the group consisting of a Si-metal compound, a Ge-metal compound and a Si—Ge metal compound. The metal compounds may include erbium (Er), europium (Eu), samarium (Sm), platinum (Pt), cobalt (Co), nickel (Ni) or ytterbium (Yb). The first barrier pattern 126 may have a lower thermal conductivity than the first semiconductor pattern 116 and the second semiconductor pattern 131. The first barrier pattern 126 may have a higher electric conductivity than the first semiconductor pattern 116 and the second semiconductor pattern 131. The first leg 111 may form an ohmic contact with the first electrode 110. A capping pattern 146 may be provided on the sidewalls of the first leg 111. The capping pattern 146 may be a silicon nitride layer, a silicon oxide layer, or a silicon oxynitride layer.

A second leg 151 may be provided on the second electrode 150. The second leg 151 may include a third semiconductor pattern 156, a second barrier pattern 166, and a fourth semiconductor pattern 171. The third semiconductor pattern 156 and the fourth semiconductor pattern 171 may include a P-type semiconductor. The third semiconductor pattern 156 and the fourth semiconductor pattern 171 may include different materials or may have different electrical characteristics. For example, the third semiconductor pattern 156 and the fourth semiconductor pattern 171 may have different electric conductivities. The second barrier pattern 166 may be provided between the third semiconductor pattern 156 and the fourth semiconductor pattern 171. The second barrier pattern 166 may be formed in plurality in the second leg 151. The second barrier pattern 166 may form an ohmic contact with the third semiconductor pattern 156 and the fourth semiconductor pattern 171. The second barrier pattern 166 may include one or more selected from the group consisting of a Si-metal compound, a Ge-metal compound and a Si—Ge metal compound. The metal compounds may include erbium (Er), europium (Eu), samarium (Sm), platinum (Pt), cobalt (Co), nickel (Ni) or ytterbium (Yb). The second barrier pattern 166 may have a lower thermal conductivity than the third semiconductor pattern 156 and the fourth semiconductor pattern 171. The second barrier pattern 166 may have a higher electric conductivity than the third semiconductor pattern 156 and the fourth semiconductor pattern 171. The second leg 151 may form an ohmic contact with the second electrode 150. The first leg 111 and the second leg 151 may be provided in an insulating layer 180.

Silicon and germanium have low ZT values because they have high thermal conductivities. The thermoelectric device according to the embodiment 1 of the present invention can reduce the thermal conductivity by the first barrier pattern 126 and the second barrier pattern 166. Also, the first barrier pattern 126 and the second barrier pattern 166 have high electric conductivities, thus increasing the ZT value of the thermoelectric device.

A common electrode 190 may be provided on the first leg 111 and the second leg 151. The common electrode 190 may be a semiconductor layer. The common electrode 190 may be a silicon or germanium layer. The common electrode 190 may be a metal layer or a metal compound layer. The common electrode 190 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In).

In the thermoelectric device according to the embodiment 1 of the present invention, the common electrode 190 may be isolated by the insulating layer 180 from the first and second electrodes 110 and 150. The common electrode 190 may serve as a heat absorption unit. The first and second electrodes 110 and 150 may serve as a heat dissipation unit. Also, the efficiency of the thermoelectric device can be increased by the first barrier pattern 126 and the second barrier pattern 166.

Hereinafter, a method for fabricating the thermoelectric device according to the embodiment 1 of the present invention will be described with reference to FIGS. 2 to 13.

Figure 2:
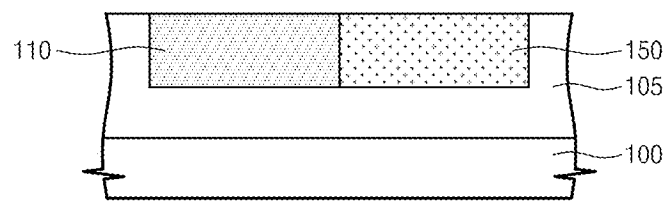

Referring to FIG. 2, a preparing layer 105 may be formed on a substrate 100. The substrate 100 may be a silicon (Si) or germanium (Ge) substrate. The preparing layer 105 may be a silicon or germanium layer. The preparing layer 105 may be an insulating layer. The preparing layer 105 may be a silicon oxide layer. The preparing layer 105 may be formed by epitaxial growth or chemical vapor deposition (CVD). A first electrode 110 and a second electrode 150 are formed in the preparing layer 105. The first electrode 110 may be formed by exposing a portion of the preparing layer 105 through a photolithography process and then implanting impurities through an ion implantation process or a diffusion process. The second electrode 150 may be formed by exposing a portion of the preparing layer 105 through a photolithography process and then implanting impurities through an ion implantation process or a diffusion process. The first and second electrodes 110 and 150 may be a metal layer or a metal compound layer. The first and second electrodes 110 and 150 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The first and second electrodes 110 and 150 may be formed by physical vapor deposition (PVD) such as evaporation or sputtering. The first and second electrodes 110 and 150 may be formed directly on the substrate 100 without the preparing layer 105 interposed therebetween.

Figure 3:
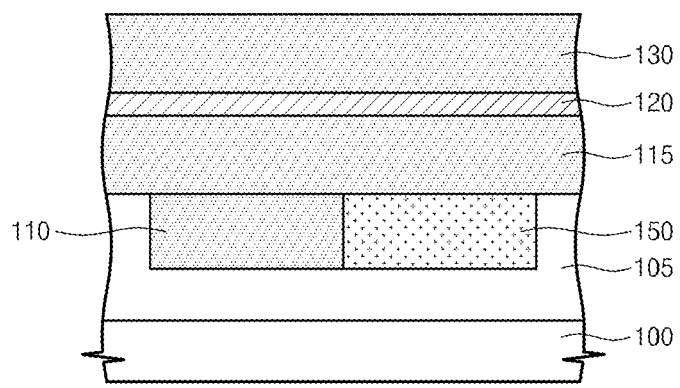

Referring to FIG. 3, a first semiconductor layer 115 may be formed on the first electrode 110. The first semiconductor layer 115 may be a silicon or germanium layer doped with first conductivity type impurities. The first semiconductor layer 115 may be formed from the preparing layer 105 through an epitaxy process. The first semiconductor layer 115 may be formed on the preparing layer 105 by chemical vapor deposition (CVD). A first metal layer 120 may be formed on the first semiconductor layer 115. The first metal layer 120 may include one or more selected from the group consisting of erbium (Er), europium (Eu), samarium (Sm), platinum (Pt), cobalt (Co), nickel (Ni) and ytterbium (Yb). The first metal layer 120 may be formed by physical vapor deposition (PVD) such as evaporation or sputtering. A second semiconductor layer 130 may be formed on the first metal layer 120. The second semiconductor layer 130 may include the same material as the first semiconductor layer 115. The second semiconductor layer 130 may be an N type.

Figure 4:
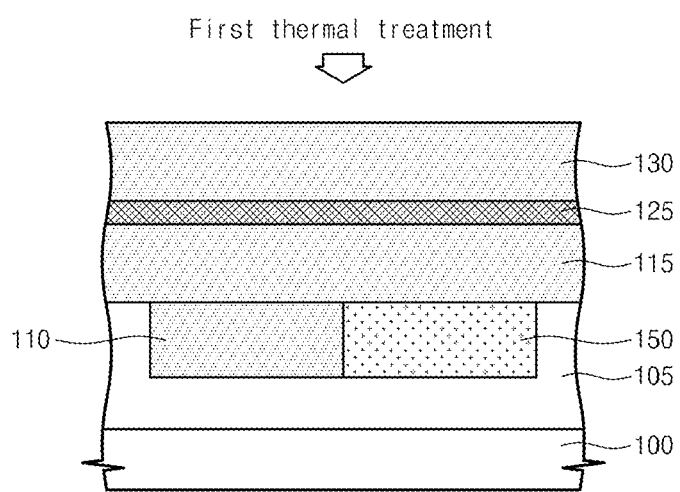

Referring to FIG. 4, a first thermal treatment process may be performed. The first thermal treatment process may include heating the first metal layer 120 to a predetermined temperature. Through the first thermal treatment process, the first metal layer 120 may become a first barrier layer 125. At least a portion of the first metal layer 120 may react with the first semiconductor layer 115 and the second semiconductor layer 130 to become at least one of a Si-metal compound, a Ge-metal compound and a Si—Ge metal compound. The first barrier layer 125 may form an ohmic contact with the first semiconductor layer 115 and the second semiconductor layer 130.

Figure 5:
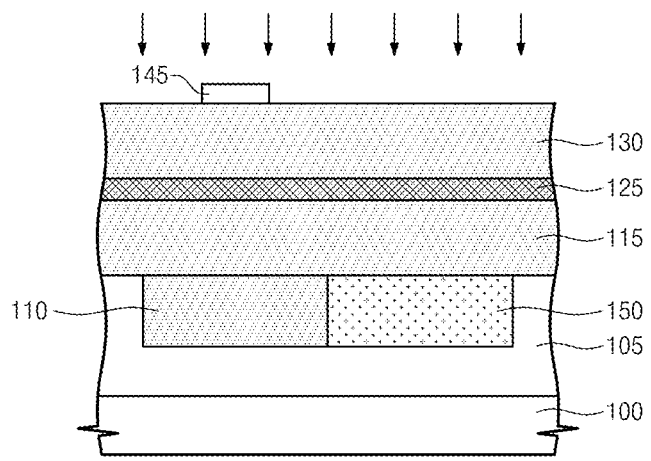
Figure 6:
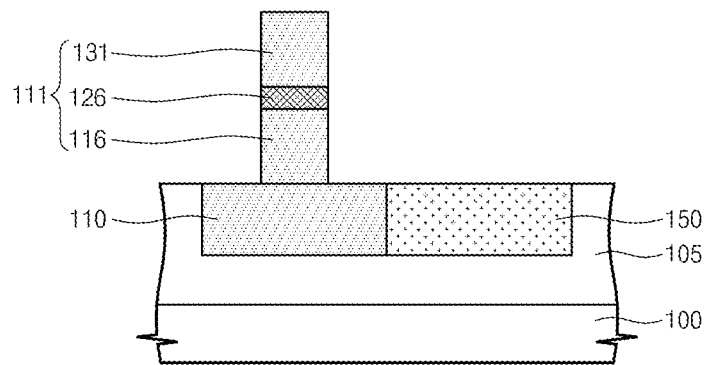

Referring to FIGS. 5 and 6, a first mask pattern 145 may be formed on the second semiconductor layer 130 and then a patterning process may be performed thereon. The patterning process may be a dry etching process. A first leg 111 may be formed through the patterning process. The first leg 111 may include a first semiconductor pattern 116, a first barrier pattern 126, and a second semiconductor pattern 131.

Figure 7:
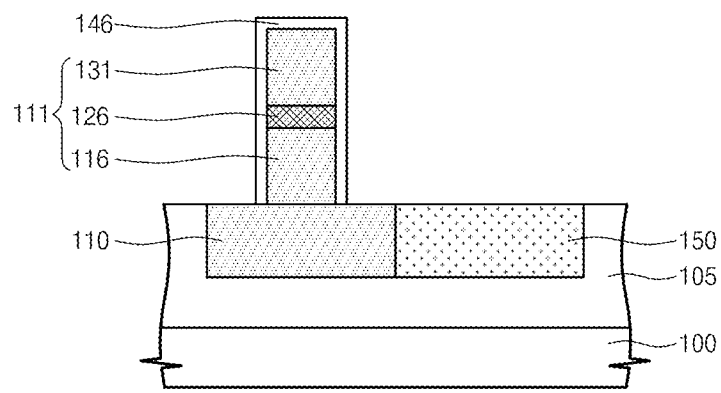

Referring to FIG. 7, a capping pattern 146 may be formed on the top surface and the sidewalls of the first leg 111. The capping pattern 146 may be a silicon nitride layer, a silicon oxide layer, or a silicon oxynitride layer. The capping pattern 146 may be formed by conformally depositing a silicon nitride layer, a silicon oxide layer or a silicon oxynitride layer and then etching a portion thereof.

Figure 8:
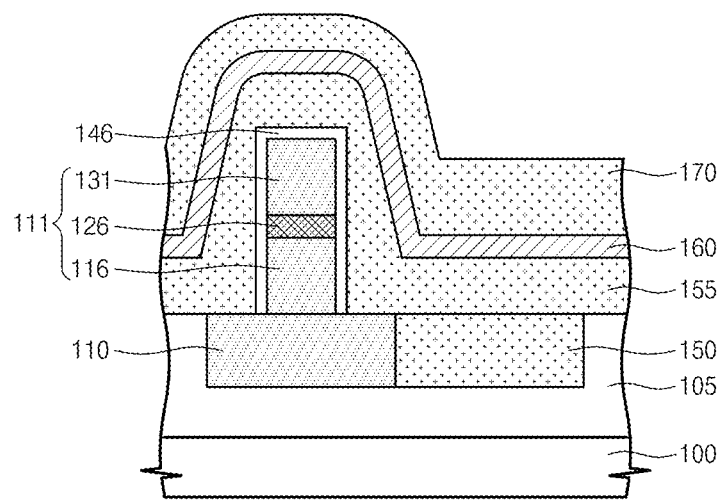

Referring to FIG. 8, a third semiconductor layer 155 may be formed on the second electrode 150. The third semiconductor layer 155 may be formed in the same way as the first semiconductor layer 115. The third semiconductor layer 155 may be a P type. A second metal layer 160 may be formed on the third semiconductor layer 155. The second metal layer 160 may be formed in the same way as the first metal layer 120. A fourth semiconductor layer 170 may be formed on the second metal layer 160. The fourth semiconductor layer 170 may include the same material as the third semiconductor layer 155. The fourth semiconductor layer 170 may be a P type.

Figure 9:
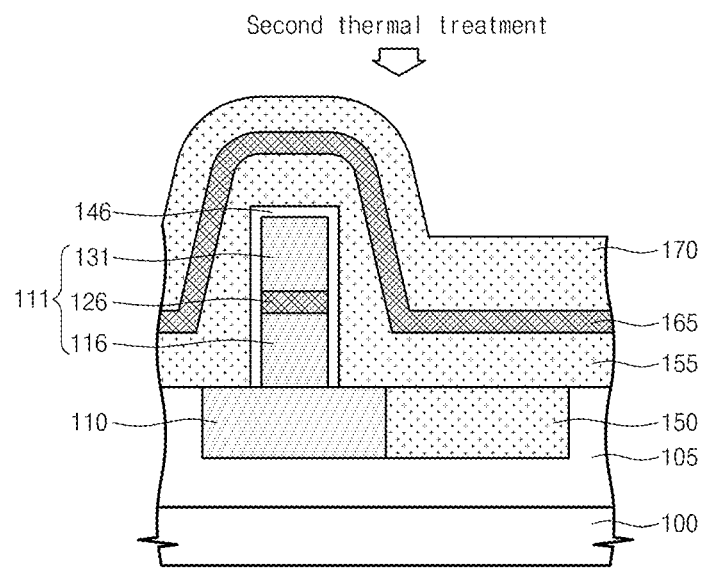

Referring to FIG. 9, a second thermal treatment process may be performed. The second thermal treatment process may include heating the second metal layer 160 to a predetermined temperature. Through the second thermal treatment process, the second metal layer 160 may become a second barrier layer 165. At least a portion of the second metal layer 160 may react with the third semiconductor layer 155 and the fourth semiconductor layer 170 to become at least one of a Si-metal compound, a Ge-metal compound and a Si—Ge metal compound. The second barrier layer 165 may form an ohmic contact with the third semiconductor layer 155 and the fourth semiconductor layer 170.

Figure 10:
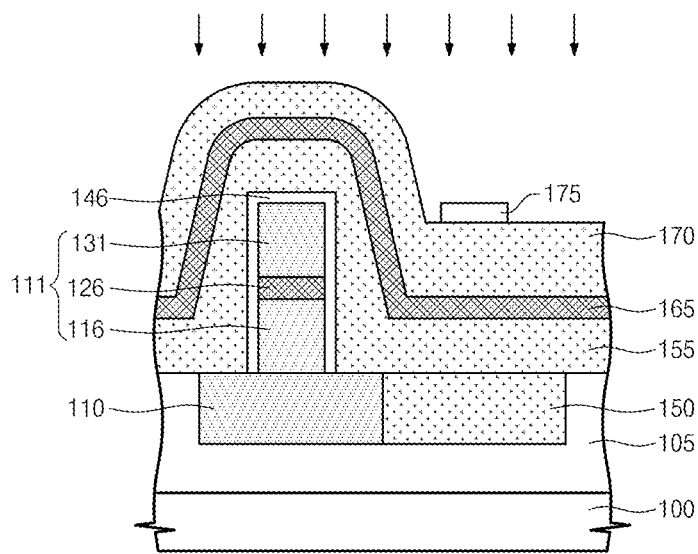
Figure 11:
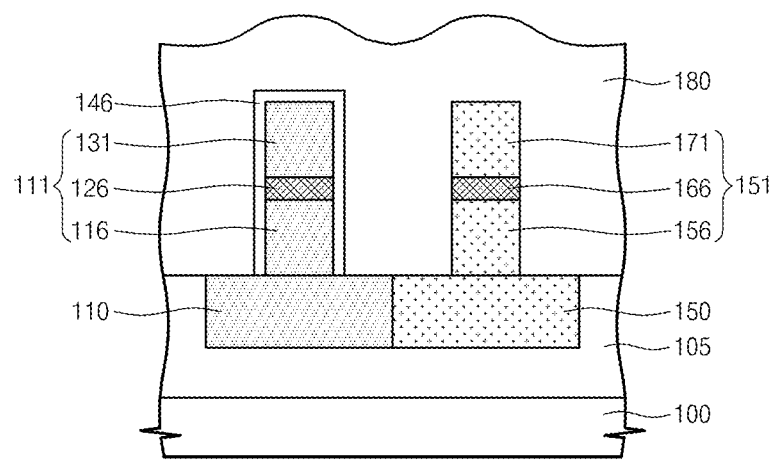

Referring to FIGS. 10 and 1, the third semiconductor layer 155, the second barrier layer 165, and the fourth semiconductor layer 170 may be patterned. The patterning process may be performed using a second mask pattern 175. A second leg 151 may be formed through the patterning process. The second leg 151 may include a third semiconductor pattern 156, a second barrier pattern 166, and a fourth semiconductor pattern 171. During the patterning process, the top and side surfaces of the first leg 111 may be protected by the capping pattern 146. An insulating layer 180 may be formed on the first leg 111 and the second leg 151.

Figure 12:
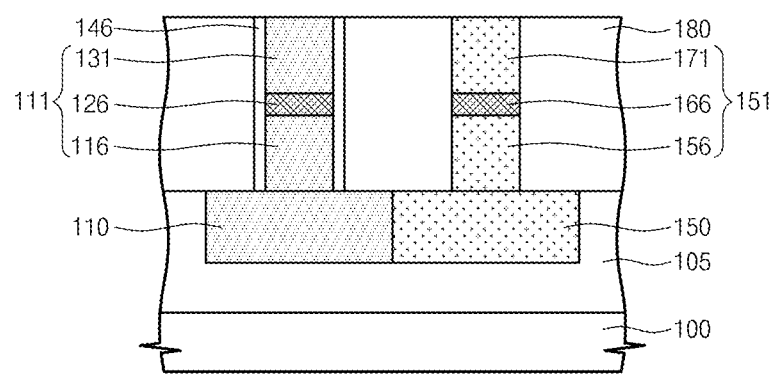

Referring to FIG. 12, the insulating layer 180 may be planarized. The planarization process may be chemical mechanical polishing (CMP). A portion of the capping pattern 146 may be removed through the planarization process. The top surface of the second semiconductor pattern 131 and the top surface of the fourth semiconductor pattern 171 may be exposed by the planarization process.

Figure 13:
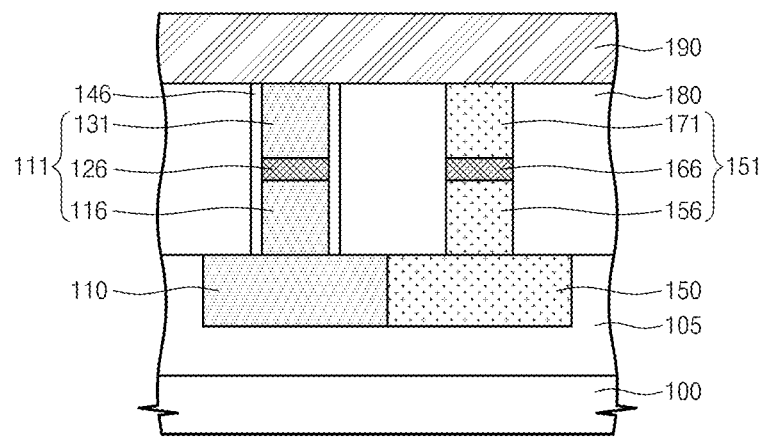

Referring to FIG. 13, a common electrode 190 may be formed on the first leg 111 and the second leg 151. The common electrode 190 may be a semiconductor layer. The common electrode 190 may be a silicon or germanium layer. The common electrode 190 may be formed by epitaxial growth or CVD. The common electrode 190 may be a metal layer or a metal compound layer. The common electrode 190 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The common electrode 190 may be formed by PVD such as evaporation or sputtering.

The thermoelectric device according to the embodiment 1 of the present invention may be fabricated through a semiconductor CMOS process. Also, the efficiency of the thermoelectric device can be increased by the first barrier pattern 126 and the second bather pattern 166.

Embodiment 2

FIGS. 14 to 20 are sectional views illustrating a thermoelectric device and a method for fabricating the same according to an embodiment 2 of the present invention. Except the thermoelectric device formation order and the electrode isolation type, the embodiment 2 is similar to the embodiment 1. Thus, a description of an overlap therebetween will be omitted for conciseness.

Figure 14:
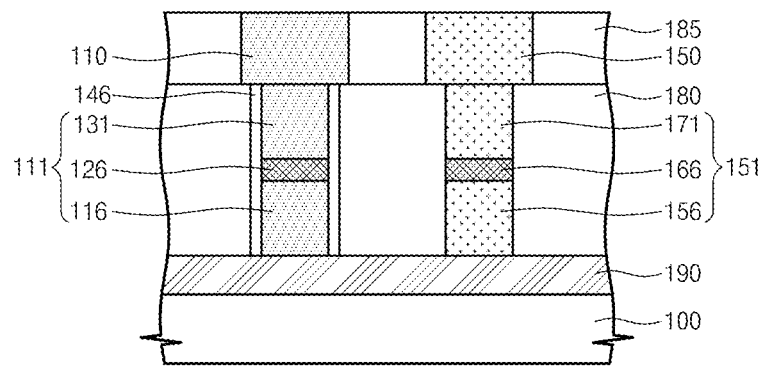
FIGS. 14 to 20 are sectional views illustrating a thermoelectric device and a method for fabricating the same according to an embodiment 2 of the present invention.

Referring to FIG. 14, a thermoelectric device according to the embodiment 2 of the present invention is provided. A common electrode 190 may be provided on a substrate 100. The substrate 100 may be a silicon (Si) or germanium (Ge) substrate. The common electrode 190 may be a semiconductor layer. The common electrode 190 may be a silicon or germanium layer. The common electrode 190 may be a metal layer or a metal compound layer. The common electrode 190 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In).

A first leg 111 may be provided on the common electrode 190. The first leg 111 may include a first semiconductor pattern 116, a first barrier pattern 126, and a second semiconductor pattern 131. The first semiconductor pattern 116 and the second semiconductor pattern 131 may be an N-type semiconductor. The first barrier pattern 126 may be provided between the first semiconductor pattern 116 and the second semiconductor pattern 131. The first barrier pattern 126 may be formed in plurality in the first leg 111. The first barrier pattern 126 may form an ohmic contact with the first semiconductor pattern 116 and the second semiconductor pattern 131. The first barrier pattern 126 may include one or more selected from the group consisting of a Si-metal compound, a Ge-metal compound and a Si—Ge metal compound. The metal compounds may include erbium (Er), europium (Eu), samarium (Sm), platinum (Pt), cobalt (Co), nickel (Ni), or ytterbium (Yb). The first barrier pattern 126 may have a lower thermal conductivity than the first semiconductor pattern 116 and the second semiconductor pattern 131. The first barrier pattern 126 may have a higher electric conductivity than the first semiconductor pattern 116 and the second semiconductor pattern 131. A capping pattern 146 may be provided on the sidewalls of the first leg 111. The capping pattern 146 may be a silicon oxide layer, a silicon nitride layer, or a silicon oxynitride layer.

A second leg 151 may be provided on the common electrode 190. The second leg 151 may include a third semiconductor pattern 156, a second barrier pattern 166, and a fourth semiconductor pattern 171. The third semiconductor pattern 156 and the fourth semiconductor pattern 171 may be a P-type semiconductor. The second barrier pattern 166 may be provided between the third semiconductor pattern 156 and the fourth semiconductor pattern 171. The second barrier pattern 166 may be formed in plurality in the second leg 151. The second barrier pattern 166 may form an ohmic contact with the third semiconductor pattern 156 and the fourth semiconductor pattern 171. The second barrier pattern 166 may include one or more selected from the group consisting of a Si-metal compound, a Ge-metal compound and a Si—Ge metal compound. The metal compounds may include erbium (Er), europium (Eu), samarium (Sm), platinum (Pt), cobalt (Co), nickel (Ni) or ytterbium (Yb). The second barrier pattern 166 may have a lower thermal conductivity than the third semiconductor pattern 156 and the fourth semiconductor pattern 171. The second barrier pattern 166 may have a higher electric conductivity than the third semiconductor pattern 156 and the fourth semiconductor pattern 171. The first leg 111 and the second leg 151 may be provided in a first insulating layer 180.

A first electrode 110 may be provided on the first leg 111. The first electrode 110 may be a semiconductor electrode. A second electrode 150 may be provided on the second leg 151. The second electrode 150 may be a semiconductor electrode. The first and second electrodes 110 and 150 may be a metal layer or a metal compound layer. The first and second electrodes 110 and 150 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The first electrode 110 may be electrically connected to the second electrode 150 by a second insulating layer 185.

In the thermoelectric device according to the embodiment 2 of the present invention, the common electrode 190 may be isolated by the first insulating layer 180 from the first and second electrodes 110 and 150. The common electrode 190 may serve as a heat absorption unit. The first and second electrodes 110 and 150 may serve as a heat dissipation unit. Also, the efficiency of the thermoelectric device can be increased by the first barrier pattern 126 and the second barrier pattern 166.

Hereinafter, a method for fabricating the thermoelectric device according to the embodiment 2 of the present invention will be described with reference to FIGS. 15 to 20.

Figure 15:
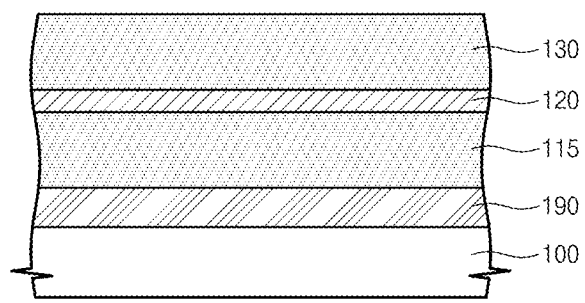

Referring to FIG. 15, a common electrode 190 may be formed on a substrate 100. The common electrode 190 may be a semiconductor layer. The common electrode 190 may be a silicon or germanium layer. The common electrode 190 may be formed by epitaxial growth or CVD. The common electrode 190 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The common electrode 190 may be formed by PVD such as evaporation or sputtering.

A first semiconductor layer 115 may be formed on the common electrode 190. The first semiconductor layer 115 may be a silicon or germanium layer doped with first conductivity type impurities. The first semiconductor layer 115 may be formed from the substrate 100 through an epitaxy process. The first semiconductor layer 115 may be formed on the common electrode 190 by chemical vapor deposition (CVD). A first metal layer 120 may be formed on the first semiconductor layer 115. The first metal layer 120 may include one or more selected from the group consisting of erbium (Er), europium (Eu), samarium (Sm), platinum (Pt), cobalt (Co), nickel (Ni) and ytterbium (Yb). The first metal layer 120 may be formed by PVD such as evaporation or sputtering. A second semiconductor layer 130 may be formed on the first metal layer 120. The second semiconductor layer 130 may be formed of the same material as the first semiconductor layer 115. The second semiconductor layer 130 may be an N type.

Figure 16:
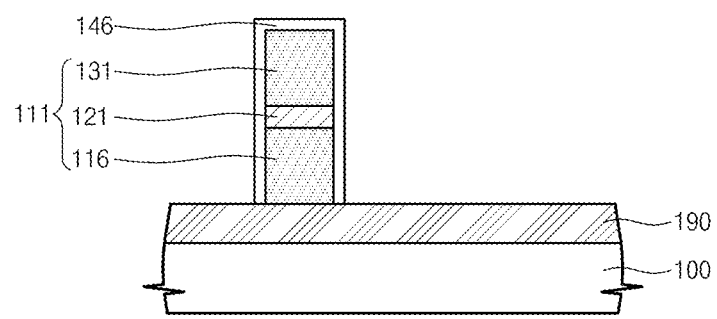

Referring to FIG. 16, a mask pattern (not illustrated) may be formed on the second semiconductor layer 130 and then a patterning process may be performed thereon. The patterning process may be a dry etching process. A first leg 111 may be formed through the patterning process. The first leg 111 may include a first semiconductor pattern 116, a first barrier pattern 126, and a second semiconductor pattern 131. A capping pattern 146 may be formed on the top surface and the sidewalls of the first leg 111. The capping pattern 146 may be a silicon nitride layer, a silicon oxide layer, or a silicon oxynitride layer. The capping pattern 146 may be formed by conformally depositing a silicon nitride layer, a silicon oxide layer or a silicon oxynitride layer and then etching a portion thereof.

Figure 17:
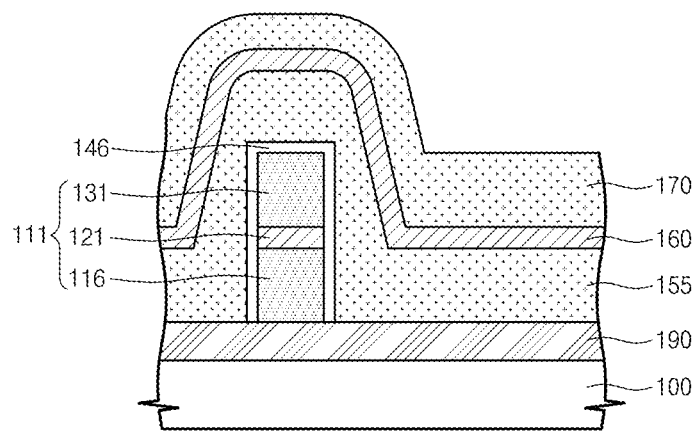

Referring to FIG. 17, a third semiconductor layer 155 may be formed on the common electrode 190. The third semiconductor layer 155 may be formed in the same way as the first semiconductor layer 115. The third semiconductor layer 155 may be a P type. A second metal layer 160 may be formed on the third semiconductor layer 155. The second metal layer 160 may be formed in the same way as the first metal layer 120. A fourth semiconductor layer 170 may be formed on the second metal layer 160. The fourth semiconductor layer 170 may be formed of the same material as the third semiconductor layer 155. The fourth semiconductor layer 170 may be a P type.

Figure 18:
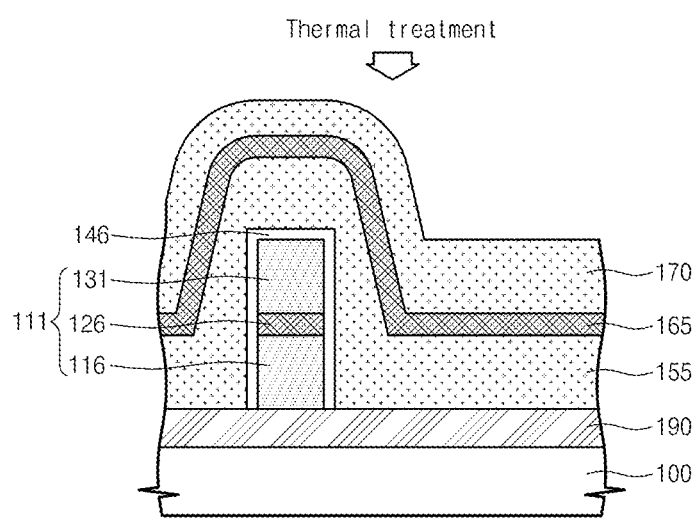

Referring to FIG. 18, a thermal treatment process may be performed. The thermal treatment process may include heating the first metal pattern 121 and the second metal layer 160 to a predetermined temperature. Through the thermal treatment process, the first metal pattern 121 may become a first barrier pattern 126. At least a portion of the first metal pattern 121 may react with the first semiconductor pattern 116 and the second semiconductor pattern 131 to become at least one of a Si-metal compound, a Ge-metal compound and a Si—Ge metal compound. The first barrier pattern 126 may form an ohmic contact with the first semiconductor pattern 116 and the second semiconductor pattern 131. Through the thermal treatment process, the second metal layer 160 may become a second barrier layer 165. At least a portion of the second metal layer 160 may react with the third semiconductor layer 155 and the fourth semiconductor layer 170 to become at least one of a Si-metal compound, a Ge-metal compound and a Si—Ge metal compound. The second barrier layer 165 may form an ohmic contact with the third semiconductor layer 155 and the fourth semiconductor layer 170.

Figure 19:
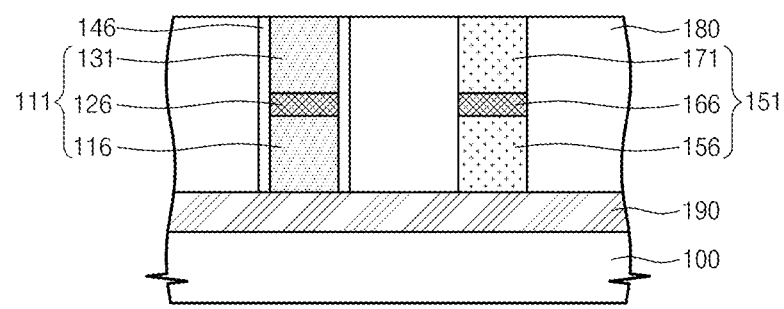

Referring to FIG. 19, the third semiconductor layer 155, the second barrier layer 165, and the fourth semiconductor layer 170 may be patterned. The patterning process may be performed using a mask pattern. A second leg 151 may be formed through the patterning process. The second leg 151 may include a third semiconductor pattern 156, a second barrier pattern 166, and a fourth semiconductor pattern 171. During the patterning process, the top surface and side walls of the first leg 111 may be protected by the capping pattern 146. A first insulating layer 180 may be formed on the first leg 111 and the second leg 151. The first insulating layer 180 may be planarized. The planarization process may be chemical mechanical polishing (CMP). A portion of the capping pattern 146 may be removed through the planarization process. The top surface of the second semiconductor pattern 131 and the top surface of the fourth semiconductor pattern 171 may be exposed by the planarization process.

Figure 20:
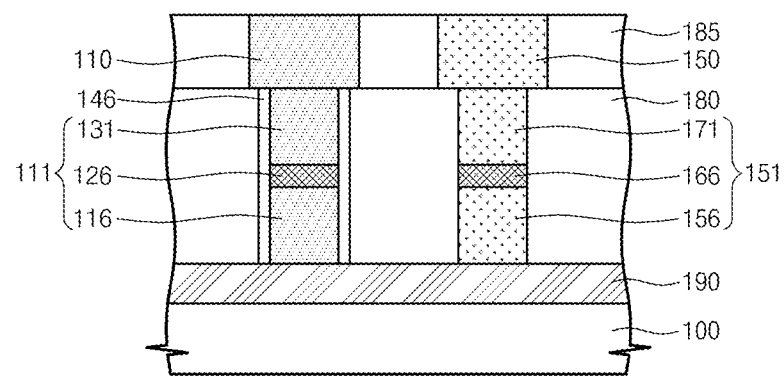

Referring to FIG. 20, a first electrode 110 may be formed on the first leg 111. A second insulating layer 185 may be formed on the first leg 111, and then the first electrode 110 may be formed in a recess region formed by patterning the resulting structure. The first electrode 110 may be formed in the recess region through a CVD process. In another embodiment, the first electrode 110 may be formed by forming a semiconductor layer or a metal layer on the first leg 111 and then patterning the resulting structure. The first electrode 110 may be formed from the first leg 111 through an epitaxy process. The first electrode 110 may be a semiconductor electrode. The second electrode 150 may be formed in the same way as the first electrode 110. The first and second electrodes 110 and 150 may be a metal layer or a metal compound layer. The first and second electrodes 110 and 150 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In). The first and second electrodes 110 and 150 may be formed by PVD such as evaporation or sputtering. The first electrode 110 and the second electrode 150 may be electrically isolated by the second insulating layer 185.

The thermoelectric device according to the embodiment 2 of the present invention may be fabricated through a semiconductor CMOS process. Also, the efficiency of the thermoelectric device can be increased by the first barrier pattern 126 and the second barrier pattern 166.

Embodiment 3

Figure 21:
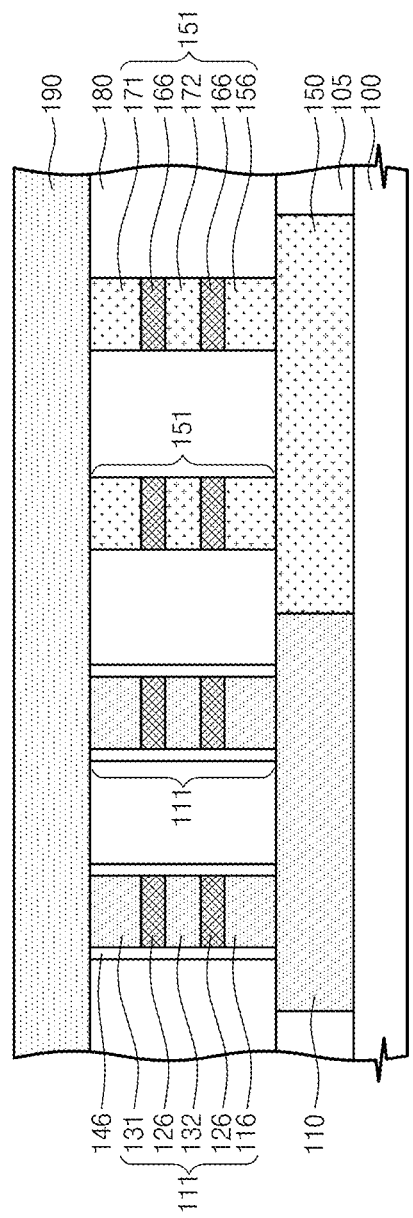
FIG. 21 is a sectional view illustrating a thermoelectric device and a method for fabricating the same according to an embodiment 3 of the present invention.

FIG. 21 is a sectional view illustrating a thermoelectric device and a method for fabricating the same according to an embodiment 3 of the present invention. Except the number of legs and the number of barrier patterns, the embodiment 3 is similar to the embodiment 1. Thus, a description of an overlap therebetween will be omitted for conciseness.

Referring to FIG. 21, a preparing layer 105 may be provided on a substrate 100. A first electrode 110 and a second electrode 150 are provided on the preparing layer 105. The substrate 100 may be a silicon (Si) or germanium (Ge) substrate. The first electrode 110 may be a semiconductor electrode. The second electrode 150 may be a semiconductor electrode. The first and second electrodes 110 and 150 may be a metal layer or a metal compound layer. The first electrode 110 may be electrically connected to the second electrode 150 by contacting the second electrode 150.

First legs 111 may be provided on the first electrode 110. The first legs 111 may include first semiconductor patterns 116, 131 and 132, and first barrier patterns 126. The first semiconductor patterns 116, 131 and 132 may be an N-type semiconductor. The first barrier patterns 126 may be provided between the first semiconductor patterns 116, 131 and 132. There is no limitation on the number of the first barrier patterns 126.

The first barrier patterns 126 may form an ohmic contact with the first semiconductor patterns 116, 131 and 132. The first barrier patterns 126 may include one or more selected from the group consisting of a Si-metal compound, a Ge-metal compound and a Si—Ge metal compound. The first barrier patterns 126 may have a lower thermal conductivity than the first semiconductor patterns 116, 131 and 132. The first barrier patterns 126 may have a higher electric conductivity than the first semiconductor patterns 116, 131 and 132. A capping pattern 146 may be provided on the sidewalls of the first legs 111. The first legs 111 may be provided in plurality as illustrated in FIG. 21.

Second legs 151 may be provided on the second electrode 150. The second legs 151 may include second semiconductor patterns 156, 171 and 172, and second barrier patterns 166. The second semiconductor patterns 156, 171 and 172 may be a P-type semiconductor. The second barrier patterns 166 may be provided between the second semiconductor patterns 156, 171 and 172. The second barrier patterns 166 may form an ohmic contact with the second semiconductor patterns 156, 171 and 172. The second barrier patterns 166 may include one or more selected from the group consisting of a Si-metal compound, a Ge-metal compound and a Si—Ge metal compound. The second barrier patterns 166 may have a lower thermal conductivity than the second semiconductor patterns 156, 171 and 172. The second barrier patterns 166 may have a higher electric conductivity than the second semiconductor patterns 156, 171 and 172. There is no limitation on the number of the second legs 151. The first legs 111 and the second legs 151 may be provided in an insulating layer 180.

The thermoelectric device according to the embodiment 3 of the present invention can reduce the thermal conductivity by the first barrier patterns 126 and the second barrier patterns 166. Also, the first barrier patterns 126 have a higher electric conductivity than the first semiconductor patterns 116, 131 and 132, and the second barrier patterns 166 may have a higher electric conductivity than the second semiconductor patterns 156, 171 and 172, thus increasing the ZT value of the thermoelectric device.

A common electrode 190 may be provided on the first legs 111 and the second legs 151. The common electrode 190 may be a semiconductor layer. The common electrode 190 may be a silicon or germanium layer. The common electrode 190 may be a metal layer or a metal compound layer. The common electrode 190 may include one or more selected from the group consisting of aluminum (Al), cuprum (Cu), tungsten (W), titanium (Ti), argentum (Ag), aurum (Au), platinum (Pt), nickel (Ni), carbon (C), molybdenum (Mo), tantalum (Ta), iridium (Ir), ruthenium (Ru), zinc (Zn), stannum (Sn), chrome (Cr) and indium (In).

In the thermoelectric device according to the embodiment 3 of the present invention, the common electrode 190 may be isolated by the insulating layer 180 from the first and second electrodes 110 and 150. Also, the efficiency of the thermoelectric device can be increased by the first barrier patterns 126 and the second barrier patterns 166.

Figure 22:
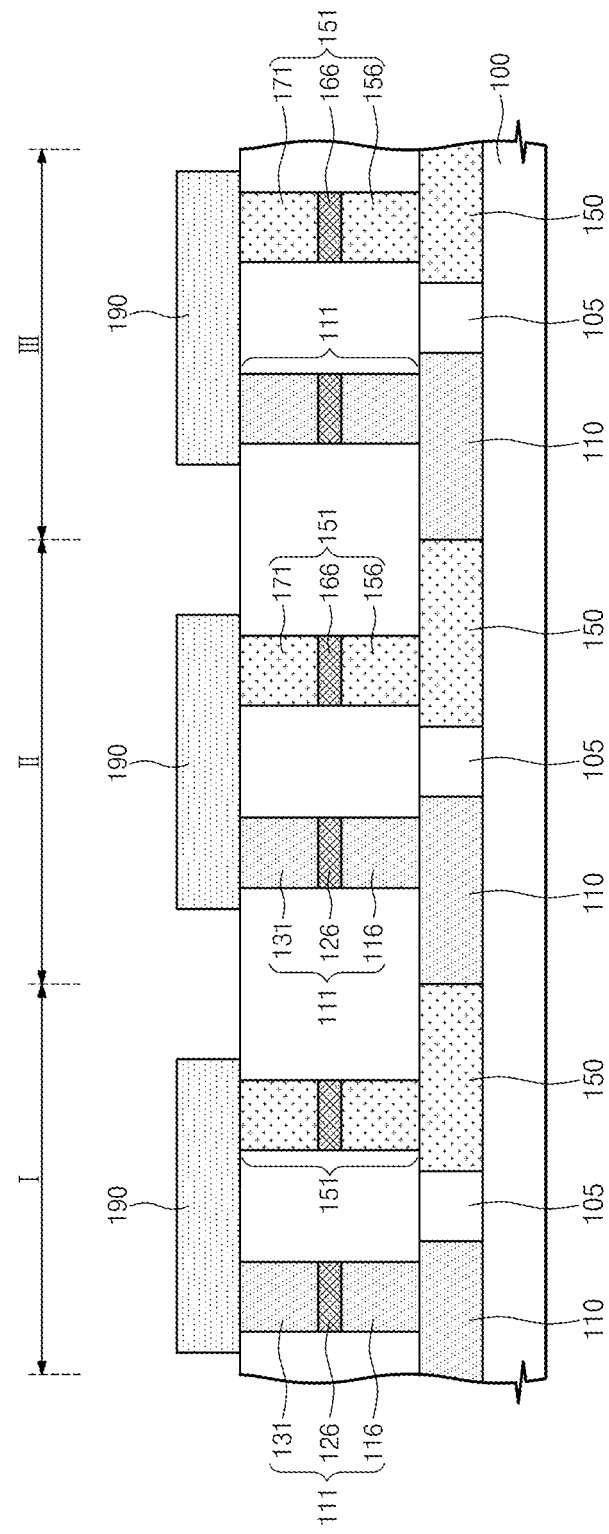
FIG. 22 is a sectional view of a thermoelectric device array according to embodiments of the present invention.

FIG. 22 is a sectional view of a thermoelectric device array according to embodiments of the present invention.

Referring to FIG. 22, a second electrode 150 of a first thermoelectric device I may be electrically connected to a first electrode 110 of the second thermoelectric device II. A second electrode 150 of the second thermoelectric device II may be electrically connected to a first electrode 110 of a third thermoelectric device III. The first electrodes 110 of the first to third thermoelectric devices I, II and III may be N-type semiconductors. The second electrodes 150 of the first to third thermoelectric devices I, II and III may be P-type semiconductors. The first and second electrodes 110 and 150 may be metal layers or metal compound layers.

When heat is supplied to a common electrode 190 of the first to third thermoelectric devices I, II and III, a current may flow from the first electrode 110 of the first thermoelectric device I to the second electrode 150 of the third thermoelectric device III.

As described above, the present invention provides methods of fabricating thermoelectric devices by using semiconductor processes. The barrier pattern is provided in the leg, thereby making it possible to reduce the thermal conductivity of the leg and increase the electric conductivity thereof. Also, the thermoelectric device is formed in a vertical type, thereby facilitating isolation between the heat absorption unit and the heat dissipation unit.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A thermoelectric device comprising:
   first and second electrodes;
   a first leg coupled to the first electrode and including two or more first semiconductor patterns and one or more first barrier patterns;
   a second leg coupled to the second electrode and including two or more second semiconductor patterns and one or more second barrier patterns; and
   a common electrode coupled to the first leg and the second leg,
   wherein the first barrier pattern has a lower thermal conductivity and a higher electric conductivity than the first semiconductor patterns,
   wherein the second barrier pattern has a lower thermal conductivity and a higher electric conductivity than the second semiconductor patterns,
   wherein the first semiconductor patterns are separated from each other by the first barrier pattern, and the second semiconductor patterns are separated from each other by the second barrier pattern,
   wherein the first barrier pattern and the second barrier pattern each comprise one or more selected from the group consisting of a Si-metal alloy, a Ge-metal alloy, and a Si—Ge-metal alloy, and
   wherein the first barrier pattern forms an ohmic contact with the first semiconductor patterns, and the second barrier pattern forms an ohmic contact with the second semiconductor patterns.

2. The thermoelectric device of claim 1, wherein the first semiconductor patterns are first conductivity type semiconductor patterns, and the second semiconductor patterns are second conductivity type semiconductor patterns.

3. The thermoelectric device of claim 1, wherein the first semiconductor patterns and the second semiconductor patterns each comprise silicon (Si) or germanium (Ge).

4. The thermoelectric device of claim 1, wherein the metal of the Si-metal alloy, the Ge-metal alloy, and the Si—Ge-metal alloy comprises one or more selected from the group consisting of erbium (Er), europium (Eu), samarium (Sm), platinum (Pt), cobalt (Co), nickel (Ni), and ytterbium (Yb).

5. The thermoelectric device of claim 1, wherein the common electrode, the first electrode, and the second electrode each comprise silicon (Si) or germanium (Ge).

6. The thermoelectric device of claim 1, wherein the common electrode, the first electrode, and the second electrode each comprise one or more selected from the group consisting of aluminum (Al), copper (Cu), tungsten (W), titanium (Ti), silver (Ag), gold (Au), platinum (Pt), nickel (Ni), molybdenum (Mo), tantalum (Ta), iridium (Ir), ruthenium (Ru), zinc (Zn), stannum (Sn), chrome (Cr) and indium (In).

7. The thermoelectric device of claim 1, wherein the first leg and the second leg are each provided in plurality.

8. The thermoelectric device of claim 1, the device further comprising a capping pattern over a sidewall of any of the first and second legs.

9. A thermoelectric device array comprising:
first and second thermoelectric devices each including
first and second electrodes;
a first leg coupled to the first electrode and including two or more first semiconductor patterns and one or more first barrier patterns;
a second leg coupled to the second electrode and including two or more second semiconductor patterns and one or more second barrier patterns; and
a common electrode coupled to the first leg and the second leg,
wherein the first electrode of each thermoelectric device is electrically connected to the second electrode of an adjacent thermoelectric device, and an insulating material is provided between the common electrodes of the thermoelectric devices,
wherein the first barrier pattern has a lower thermal conductivity and a higher electric conductivity than the first semiconductor patterns,
wherein the second barrier pattern has a lower thermal conductivity and a higher electric conductivity than the second semiconductor patterns,
wherein the first semiconductor patterns of the first thermoelectric device are separated from each other by the first barrier pattern, and the second semiconductor patterns of the first thermoelectric device are separated from each other by the second barrier pattern,
wherein the first barrier pattern and the second barrier pattern each comprise one or more selected from the group consisting of a Si-metal alloy, a Ge-metal alloy, and a Si—Ge-metal alloy, and
wherein the first barrier pattern forms an ohmic contact with the first semiconductor patterns, and the second barrier pattern forms an ohmic contact with the second semiconductor patterns.

10. The thermoelectric device array of claim 9, wherein the first semiconductor patterns are first conductivity type semiconductor patterns, and the second semiconductor patterns are second conductivity type semiconductor patterns.

11. The thermoelectric device array of claim 9, wherein the first semiconductor patterns and the second semiconductor patterns each comprise silicon (Si) or germanium (Ge).

12. The thermoelectric device array of claim 9, wherein the metal of the Si-metal alloy, the Ge-metal alloy, and the Si—Ge-metal alloy comprises one or more selected from the group consisting of erbium (Er), europium (Eu), samarium (Sm), platinum (Pt), cobalt (Co), nickel (Ni), and ytterbium (Yb).

13. The thermoelectric device array of claim 9, wherein the common electrode, the first electrode, and the second electrode each comprise silicon (Si) or germanium (Ge).

14. The thermoelectric array device of claim 9, wherein the common electrode, the first electrode, and the second electrode each comprise one or more selected from the group consisting of aluminum (Al), copper (Cu), tungsten (W), titanium (Ti), silver (Ag), gold (Au), platinum (Pt), nickel (Ni), molybdenum (Mo), tantalum (Ta), iridium (Ir), ruthenium (Ru), zinc (Zn), stannum (Sn), chrome (Cr) and indium (In).

15. The thermoelectric device array of claim 9, the device further comprising a capping pattern over a sidewall of any of the first and second legs.

16. A thermoelectric device comprising:
first and second electrodes;
a first leg coupled to the first electrode and including two or more first semiconductor patterns and one or more first barrier patterns;
a second leg coupled to the second electrode and including two or more second semiconductor patterns and one or more second barrier patterns; and
a common electrode coupled to the first leg and the second leg,
wherein the first barrier pattern has a lower thermal conductivity and a higher electric conductivity than the first semiconductor patterns,
wherein the second barrier pattern has a lower thermal conductivity and a higher electric conductivity than the second semiconductor patterns,
wherein the first semiconductor patterns are separated from each other by the first barrier pattern, and the second semiconductor patterns are separated from each other by the second barrier pattern,
wherein each of the first barrier pattern and the second barrier pattern is a metal silicide layer, and
wherein the first barrier pattern forms an ohmic contact with the first semiconductor patterns, and the second barrier pattern forms an ohmic contact with the second semiconductor patterns.

17. The thermoelectric device of claim 16, wherein the first semiconductor patterns are first conductivity type semiconductor patterns, and the second semiconductor patterns are second conductivity type semiconductor patterns.

18. The thermoelectric device of claim 16, wherein the first semiconductor patterns and the second semiconductor patterns each comprise silicon (Si) or germanium (Ge).

19. The thermoelectric device of claim 16, wherein the metal of the Si-metal alloy, the Ge-metal alloy, and the Si—Ge-metal alloy comprises one or more selected from the group consisting of erbium (Er), europium (Eu), samarium (Sm), platinum (Pt), cobalt (Co), nickel (Ni), and ytterbium (Yb).

* * * * *